United States Patent
Ydstie et al.

(10) Patent No.: US 11,661,672 B2
(45) Date of Patent: May 30, 2023

(54) METHOD FOR PRODUCING A SHEET FROM A MELT BY IMPOSING A PERIODIC CHANGE IN THE RATE OF PULL

(71) Applicant: CARNEGIE MELLON UNIVERSITY, Pittsburgh, PA (US)

(72) Inventors: B. Erik Ydstie, Pittsburgh, PA (US); Eyan Peter Noronha, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 159 days.

(21) Appl. No.: 17/266,417

(22) PCT Filed: Aug. 6, 2019

(86) PCT No.: PCT/US2019/045323
§ 371 (c)(1),
(2) Date: Feb. 5, 2021

(87) PCT Pub. No.: WO2020/033419
PCT Pub. Date: Feb. 13, 2020

(65) Prior Publication Data
US 2021/0310150 A1    Oct. 7, 2021

Related U.S. Application Data

(60) Provisional application No. 62/764,493, filed on Aug. 6, 2018.

(51) Int. Cl.
C30B 13/28 (2006.01)
C30B 13/14 (2006.01)
C30B 13/16 (2006.01)
C30B 29/20 (2006.01)
C30B 29/36 (2006.01)
C30B 29/42 (2006.01)

(52) U.S. Cl.
CPC .............. *C30B 13/28* (2013.01); *C30B 13/14* (2013.01); *C30B 13/16* (2013.01); *C30B 29/20* (2013.01); *C30B 29/36* (2013.01); *C30B 29/42* (2013.01)

(58) Field of Classification Search
CPC ......... C30B 13/28; C30B 13/14; C30B 13/16; C30B 29/20; C30B 29/36; C30B 29/42
See application file for complete search history.

(56) References Cited

U.S. PATENT DOCUMENTS

| | | | |
|---|---|---|---|
| 10,030,317 B2 * | 7/2018 | Kellerman | C30B 29/06 |
| 2010/0080905 A1 * | 4/2010 | Sinclair | C30B 29/06 427/255.6 |
| 2010/0294198 A1 * | 11/2010 | Wan | C30B 11/007 117/223 |
| 2011/0271897 A1 * | 11/2011 | Kellerman | C30B 29/06 117/217 |
| 2014/0096713 A1 * | 4/2014 | Sinclair | C30B 29/06 117/217 |

\* cited by examiner

*Primary Examiner* — Robert M Kunemund
(74) *Attorney, Agent, or Firm* — Michael G. Monyok

(57) ABSTRACT

A method of forming crystalline sheets using a Horizontal Ribbon Growth process, where the sheet of material formed in the process is withdrawn from a crucible in a specified manner to reduce instabilities in the process and to regulate crystal growth dynamics.

17 Claims, 1 Drawing Sheet

METHOD FOR PRODUCING A SHEET FROM A MELT BY IMPOSING A PERIODIC CHANGE IN THE RATE OF PULL

CROSS-REFERENCE TO RELATED APPLICATIONS

This application claims priority and the benefit of the filing date based on U.S. provisional application No. 62/764,493, filed Aug. 6, 2018, under 35 USC § 119, where the provisional application is hereby incorporated by reference.

STATEMENT REGARDING FEDERALLY SPONSORED RESEARCH

This invention was made with government support under National Science Foundation Grant Number CBET1438231. The government has certain rights in this invention.

BACKGROUND OF THE INVENTION

The invention relates to a process for making sheets of materials, such as silicon. More specifically, the invention relates to a method of producing single and multi-crystalline sheets from a melt using a horizontal ribbon growth process.

Producing a robust and high quality silicon sheet for semi-conductor or photovoltaic purposes is expensive. Production of silicon wafers accounts for up to ~65% of the cost of a solar cell module. Such sheets are mostly produced using ingot-based techniques such as the Czochkralski or Bridgman processes. These processes are capable of producing high-quality crystalline wafers on an industrial scale, but there are many disadvantages. For example, each of these processes dissipates large amounts of energy, and is a slow batch process that does not benefit from economies of scale as increased production requires duplicating equipment. In addition, these processes produce a large ingot of material which requires sawing to produce thin wafers several hundred microns thick, leading to more than 50% in material loss. Silicon wafers made by this method are typically very brittle and break easily.

Other processes have been developed to produce materials continuously in order to overcome the deficiencies of the Czochkralski and Bridgman processes. Examples include Edge-Defined Film-Fed Crystal Growth (EFG), Dendritic Web (WEB), Ribbon Growth on Substrate (RGS), and Horizontal Ribbon Growth (HRG). While several of these processes have been commercialized, they have failed to produce high-quality wafers at low cost.

Float process techniques, such as the Horizontal Ribbon Growth (HRG) process, have the potential to manufacture continuous sheets of single- and multi-crystalline materials at high production rates without the need for sawing. In the example of silicon, the HRG process is based on the observation that solid silicon is less dense than its liquid phase. It is therefore possible to form sheets of solid silicon by cooling a liquid bath of silicon from the top. The solid sheet of silicon forms on the top of the melt, much as ice is formed on top of water in cold weather. The complications arising in trying to obtain a crystalline sheet on a foreign substrate are eliminated since the melt is the same material as the solid sheet. Once formed, the sheet can be removed from the molten silicon continuously, with the sheet growing in the direction vertical to the pulling direction.

While the HRG process shows potential in theory, prior attempts at implementing the process have proved difficult. In one attempt used to produce ice and germanium ribbons, the crystals exhibited many irregularities resulting from the difficulty in maintaining and controlling a constant thermal heat flux to and from the ribbons of solidified material. A subsequent attempt replaced a heat sink with a gas cooling system above the melt. Despite more control over the heat flux, controlling the dynamics of crystal growth was not achieved and process instabilities were present. For example, the system experienced excessive growth of material in a direction perpendicular to the pulling direction (down-growth) or, if down-growth was suppressed, the formation of poly-crystalline dendritic crystals.

Controlling crystal growth helps improve production rates and crystal quality. One significant problem in controlling crystal growth is the formation of a facet at the leading edge of the crystal sheet. The facet planes tend to be smoother on a molecular scale, with fewer dangling bonds. During solidification, molecules attach more easily to the rough surfaces that have more chemical bonds compared to the flat surfaces. As a result, the facet surfaces advance more slowly than the rough surfaces, leading to uneven crystal growth.

Further, process instabilities arise in the HRG process due to the effect of segregation when impurities with a segregation co-efficient different from unity are present in the liquid. During crystal growth, the concentration of impurities is highest at the solidification interface. The increased concentration occurs at the interface because of a large difference in the solubility of impurities between the melt and the crystal. Impure atoms tend to diffuse preferentially in the liquid. Stated differently, as the crystal grows, impurities are rejected from the solid and transported from the interface to the melt. This manifests itself in the formation of a solute enriched boundary layer close to the crystallization front. The enriched boundary layer leads to constitutional under-cooling and gives rise to an unstable solidification front. Moreover, the presence of a solute rich boundary layer provides nucleation sites, which combined with the under-cooled melt at the leading edge, can lead to the formation of dendrites.

Therefore, it would be advantageous to develop a method of producing crystalline sheets of material using the HRG process that is able to control the crystal growth dynamics and reduce process instabilities.

BRIEF SUMMARY

According to one embodiment of the present invention, a horizontal ribbon growth (HRG) process is used to manufacture sheets of single-crystal silicon with improved quality and higher production rate by super-imposing periodic perturbations on the sheet being extracted. In one example embodiment, the periodic perturbation comprises sinusoids of a single or multiple frequencies. Additionally, a movement can be imposed on the crucible containing the melt, for example by rotating the crucible.

In the HRG process, a material is added to a crucible and melts in a first zone. The molten material flows through a second zone, or stabilization zone, to a third zone. In the third zone, a seed crystal is inserted from outside of the crucible, which acts as a nucleation site for the material to solidify in the third zone. To facilitate solidification in the third zone, the heat is removed and a solid sheet forms, growing from the seed crystal. For materials such as silicon, in which the solid is less dense than the liquid phase, the sheet floats and can be continuously withdrawn from the surface of the melt. In some processes the sheet may form by floating it on a different molten material, such as tin in the case of making silica glass. The energy balance is controlled so that heat removed balances heat released by continuous crystallization and sheet removal.

Using periodic control, the in-homogeneity that occurs with the faceted growth of the leading edge and the segregation of impurities in the melt can be drastically minimized. As a result, the crystals exhibit better quality with high purity and low defect density. Further, the process can achieve higher production rates with improved stability.

DETAILED DESCRIPTION

Figure 1:
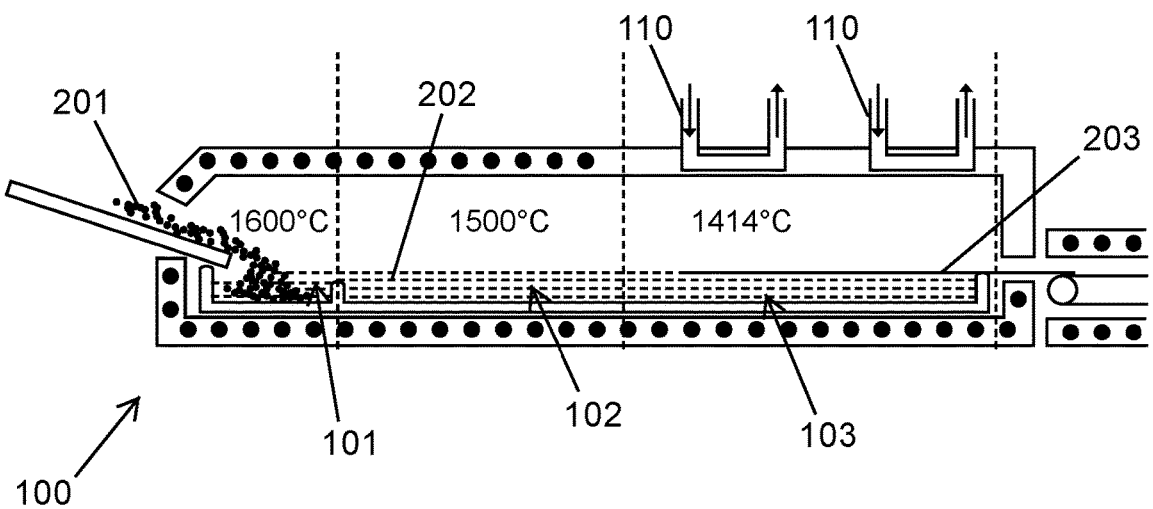
FIG. 1 shows a device used to perform the method of the present invention, according to one embodiment.

According to embodiments of the present invention is a float process for producing crystalline materials. The materials can include electronic materials such as silicon and germanium, gallium-arsenide, silicon-carbide, oxides such as sapphire (i.e. aluminum oxide), gallium oxides, and other materials that can be fabricated as a single crystal for opto-electronic applications. As shown in FIG. 1, the float process occurs in a crucible 100. In a first zone 101 of the crucible 100, solid pellets 201 of the material are loaded into the crucible 100. The temperature in the first zone 101 is above the melting temperature of the pellets 201, causing them to melt. The molten material, or melt 202, then flows to a stabilization zone 102. In a third zone 103, the material cools and a sheet 203 of solid material forms on top of the melt 202. A cooling device 110 is positioned above the third zone 103 to control the heat flux. In the embodiment shown in FIG. 1, the cooling device 110 comprises a cooling plate 111 through which a liquid coolant flows. In an alternative embodiment, the cooling device 110 may comprise a jet of inert gas, such as helium (He).

Controlled oscillations are introduced at the boundary 300 between the melt 202 and solid sheet 203 by translating the sheet 203 and/or the crucible 100 in conjunction. The oscillations promote redistribution of solid 203 and melt 202 around the interface 300, which reduces in-homogeneity around the growing crystal. The oscillations introduced into the system can vary depending on the type of material being produced and the cooling device 110 used. For example, in one embodiment, the direction of the pull is periodically reversed, creating a push/pull motion. In an alternative embodiment, the sheet is translated side-to-side relative to the direction of the pull. In yet another alternative embodiment, movement is created in the crucible. Other movements may be used that create a relative movement between the sheet 203 and the melt 202. Periodic perturbation of one or more process parameters such as the withdrawal rate of the sheet or the cooling or heating rates can produce a more robust wafer that exhibits a limited degree of mechanical flexibility. For example, the sheet 203 produced by the method, according to one embodiment, has a bending radius of about 3 inches or more.

Figure 2:
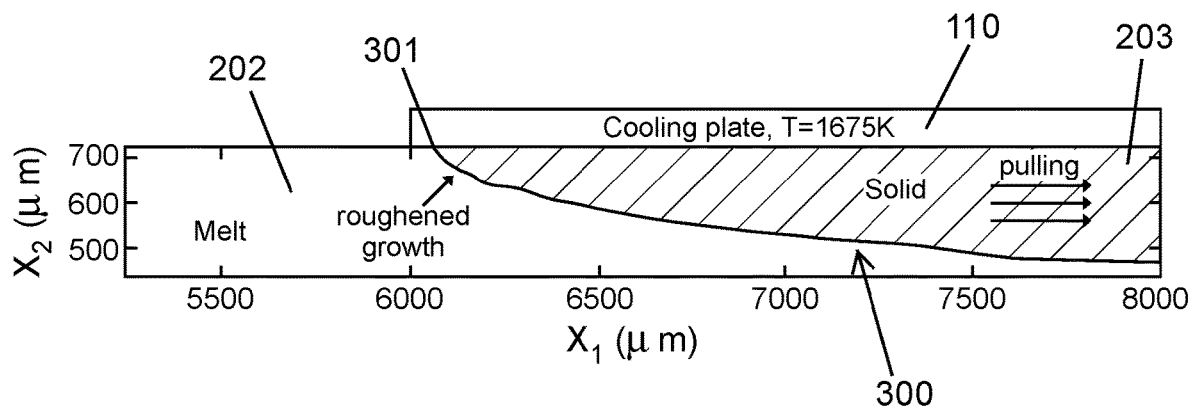
FIG. 2 shows the interface between a monocrystalline sheet and the melt.

The formation of a thin and uniform wedge, as shown in FIG. 2, produces a high-quality sheet 203. The wedge allows for appropriate thickness control by balancing heating, cooling, and pull-rate. Moreover, crystallization is nearly orthogonal to the process flow when the wedge is sharp. High production rate can then be achieved while crystallization is nearly epitaxial, as required to achieve a high-quality, crystalline sheet 203.

During a float process with constant pulling speed, the leading edge of the sheet forms a smooth facet. Facets grow via nucleation which have slow growth kinetics and require significant sub-cooling to maintain growth. Sub-cooling requires an intense amount of heat removal at the leading edge to sustain the pulling. In contrast, the method of the present invention utilizes a control method, in one embodiment, where the sheet 203 is pushed into the melt 202 and then pulled in the opposite direction at its regular speed. The solid at the leading edge of the sheet 203 can be redistributed to form a roughened surface, as shown in FIG. 2. This redistribution of solid causes the smooth surface to become roughened, which stays roughened for the remainder of the process, thereby improving crystal growth dynamics. The control method also eliminates the sub-cooling zone, creating better quality crystals with low defects.

When the mono-crystalline sheet 203 is pulled at a constant velocity, there is a definite upper limit in the production rate of the sheet. In one embodiment, the control method increases the upper limit on the production rate of the monocrystalline sheet 203.

Another objective of controlling the movement of the sheet 203 relative to the melt 202 is to homogenize the melt 202 so that the impurity boundary layer near the solidification front 301 diffuse faster into the melt 202. This combined with the loss of sub-cooling reduces the possibility of dendritic growth thereby making the process more stable.

Industry has stringent commercial standard for thickness of silicon wafers to be used for semi-conductor or electronic applications. The method, according to an embodiment of the present invention, makes it easier for thickness control by breaking the faceted wedge at the leading edge of the sheet 203, allowing the wedge to take an acute angle depending on the velocity, the period, and amplitude of the sheet pulling rate. This makes it possible for the crystal to grow uniformly along the length of the sheet 203, decoupling the direction of pulling from the direction of the solidification, which happens in the vertical direction in prior art HRG processes. Also since the mechanism for heat removal at the leading edge 301 is from the cooling device 110 instead of the pool of sub-cooled liquid, the process is easier to model and control.

It can also be advantageous to allow the sheet 203 to have an angle relative to the surface of the liquid melt 202. Such an angle stabilizes the meniscus at the point where the sheet 203 is removed from the melt 202 and helps prevent the instability and down-growth reported in previous embodiments of the HRG process. For example, in one embodiment, the sheet 203 has an angle of about 2 degrees relative to the top surface of the melt 202.

In one embodiment, the atmosphere above the melt typically consists of an inert gas such as Argon and cooling is achieved by radiation to a cold surface used as the cooling device 110. Additional cooling may be achieved by inserting jets of cold inert gases such as helium.

It may also be advantageous to introduce a small percentage of other gases into the process. For example, introducing nitrogen into the process atmosphere leads to the formation of a very thin layer of silicon-nitride on top of the melt 202. This layer stabilizes the formation of microscopic surface waves and isolates the melt 202 chemically from impurities that may be present in the atmosphere.

While the disclosure has been described in detail and with reference to specific embodiments thereof, it will be apparent to one skilled in the art that various changes and modification can be made therein without departing from the spirit and scope of the embodiments. Thus, it is intended that the present disclosure cover the modifications and variations of this disclosure provided they come within the scope of the appended claims and their equivalents.

What is claimed is:

1. A method for growing a sheet of material comprising:
   melting the material in a crucible to form a melt;
   cooling a top surface of the melt using a cooling device to form a solid sheet on the top surface of the melt; and
   withdrawing the sheet from the crucible in a first direction, wherein a rate of the withdrawal is changed periodically in a sinusoidal manner relative to a constant velocity.

2. The method of claim 1, wherein withdrawing the sheet comprises introducing a successive back and forth motion by periodically reversing a direction of the withdrawal relative to the first direction.

3. The method of claim 1, further comprising translating the sheet side-to-side relative to the first direction.

4. The method of claim 1, wherein the crucible is translated back and forth.

5. The method of claim 1 further comprising:
   rotating the crucible, wherein the crucible is circular.

6. The method of claim 1, wherein the material is selected from the group consisting of silicon and germanium.

7. The method of claim 1, wherein the material is selected from the group consisting of gallium-arsenide, silicon-carbides, oxides of aluminum, and gallium oxides.

8. The method of claim 1, wherein the sheet defines an angle of 2 degrees or more with respect to the top surface of the melt.

9. The method of claim 8, wherein a mechanism for oscillation of the sheet depends on the angle of the sheet with the melt.

10. The method of claim 1, wherein the cooling device comprises jets of an inert gas.

11. The method of claim 10, wherein the rate of the withdrawal of the sheet depends on the flow of inert gas from the jets.

12. The method of claim 1 where the atmosphere above the melt contains nitrogen.

13. The method of claim 10, wherein the inert gas comprises He or Ar.

14. A method for growing a sheet of material comprising:
   melting the material in a crucible to form a melt;
   cooling a top surface of the melt using a cooling device to form a solid sheet on the top surface of the melt, wherein a solidification front forms at a boundary between the solid sheet and the melt; and
   withdrawing the sheet from the crucible in a first direction, wherein oscillations are introduced to create a relative movement of the solidification front.

15. The method of claim 14, wherein the oscillations are sinusoidal.

16. The method of claim 14, wherein the oscillations are side-to-side relative to the first direction.

17. The method of claim 1, wherein a change in the rate of withdrawal comprises a composition of sines.

* * * * *